United States Patent [19]

Urushiwara et al.

[11] Patent Number: 4,854,292

[45] Date of Patent: Aug. 8, 1989

[54] IGNITION SYSTEM FOR INTERNAL COMBUSTION ENGINE

[75] Inventors: Noriyoshi Urushiwara, Katsuta; Noboru Sugiura, Mito; Yasunori Fujino, Hiroshima; Ryoichi Kobayashi, Ibaraki, all of Japan

[73] Assignee: Hitachi, Ltd., Tokyo, Japan

[21] Appl. No.: 173,676

[22] Filed: Mar. 25, 1988

[30] Foreign Application Priority Data

Mar. 27, 1987 [JP] Japan .................................. 62-71486

[51] Int. Cl.$^4$ .............................................. F02P 1/00
[52] U.S. Cl. ................................. 123/630; 123/644
[58] Field of Search ........... 123/630, 644, 479, 198 D, 123/198 DC

[56] References Cited

U.S. PATENT DOCUMENTS

| | | | |
|---|---|---|---|
| 3,599,618 | 8/1971 | Schuette | 123/644 |
| 3,828,750 | 8/1974 | Schuette et al. | 123/630 |
| 3,882,840 | 5/1975 | Adamian et al. | 123/644 |
| 4,008,698 | 2/1977 | Gartner | 123/644 |
| 4,174,696 | 11/1979 | Jundt et al. | 123/644 |
| 4,196,711 | 4/1980 | Daumer | 123/644 |
| 4,228,779 | 10/1980 | Wetzel | 123/644 |
| 4,367,722 | 1/1983 | Mizuno | 123/630 |
| 4,380,989 | 4/1983 | Takaki | 123/644 |
| 4,738,239 | 4/1988 | Haines et al. | 123/630 |

*Primary Examiner*—Raymond A. Nelli
*Attorney, Agent, or Firm*—Antonelli, Terry & Wands

[57] ABSTRACT

An ignition system for an internal combustion engine comprising a semiconductor switching device, which is controlled by a control unit, is disclosed. In response to an output from a device for detecting a shorting breakdown or a heat generation of a power switching device, the power switching device and the ignition coil are cut off from a power supply by a current cut-off device. Even when the power switching device is broken by shorting, the power generation due to continuous energization of the ignition coil is prevented, thereby preventing the ignition coil from being heated abnormally.

6 Claims, 7 Drawing Sheets

IGNITION SYSTEM FOR INTERNAL COMBUSTION ENGINE

BACKGROUND OF THE INVENTION

The present invention relates to an ignition system for an internal combustion engine, or more in particular to an ignition system for an internal combustion system comprising a semiconductor power switching device, in which the ignition coils are prevented from being heated by detecting a breakdown by shorting of the semiconductor power switching device.

A conventional ignition system using a semiconductor power switching device, such as a power transistor, is widely known as disclosed in JP-A-60-209667.

According to this prior art system, the primary current of sequentially-connected ignition coils is detected by a common current detection circuit for constant-current control.

In this prior art system, even though the primary current of the ignition coils is controlled below a predetermined value, a continuous current could flow in the ignition coils and the coils could be burned by being heated thereby to generate smoke or combustion of the exterior resin of the ignition coils if the power switching device were to break down due to shorting.

SUMMARY OF THE INVENTION

The primary object of the present invention is to provide an ignition system for an internal combustion engine in which the problems of the prior art ignition system described above are obviated, in which the heating of the ignition coils by continuous energization is prevented, thereby to prevent smoke emission or combustion of the exterior resin of the coil, even if the power switching device of the ignition system breaks down due to shorting.

Another object of the present invention is to provide a low-cost ignition system by reducing the required number of shorting detection mean and separation means as compared with the number of power switching devices and ignition coils.

Still another object of the present invention is to provide means for informing the operator or user immediately of a fault in the ignition system by way of an alarm or meter indication when a power switching device breaks down due to shorting.

In order to achieve the above-mentioned various objects, there is provided according to the present invention an ignition system for an internal combustion engine having means for detecting a breakdown due to shorting of a power switching device and means for separating the power switching device and an ignition coil from a power line in response to an output from the breakdown detection means.

The present invention is based on the fact that the breakdown, if any, of a power switching device is most frequently caused by shorting. If a power switching device of an ignition system breaks down in the open state, that is, by disconnection, no current flows in the broken device, and therefore the ignition coils would not be heated by continuous current. Most frequent cases of breakdown by shorting of a power switching device, however, are a dielectric breakdown of a junction, such as between the collector and emitter of the power transistor. In this type of breakdown, which is hereinafter referred to simply as a shorting breakdown, a continuous current flows in the ignition coil, which is thus heated thereby to pose various problems.

According to the present invention, a shorting breakdown by this type of a power switching device is detected, so that the power switching device and the ignition coil connected therewith are separated from a power supply thereby to block a continuous current in the ignition coil in order to prevent the ignition coil from heating, producing smoke and burning.

BRIEF DESCRIPTION OF THE DRAWINGS

Preferred embodiments of the present invention will now be described in conjunction with the accompanying drawings, in which.

DESCRIPTION OF THE PREFERRED EMBODIMENTS

An ignition system for an internal combustion engine (hereinafter referred to "an ignition system") according to the present invention will be explained in detail below by way of embodiments.

Figure 1:
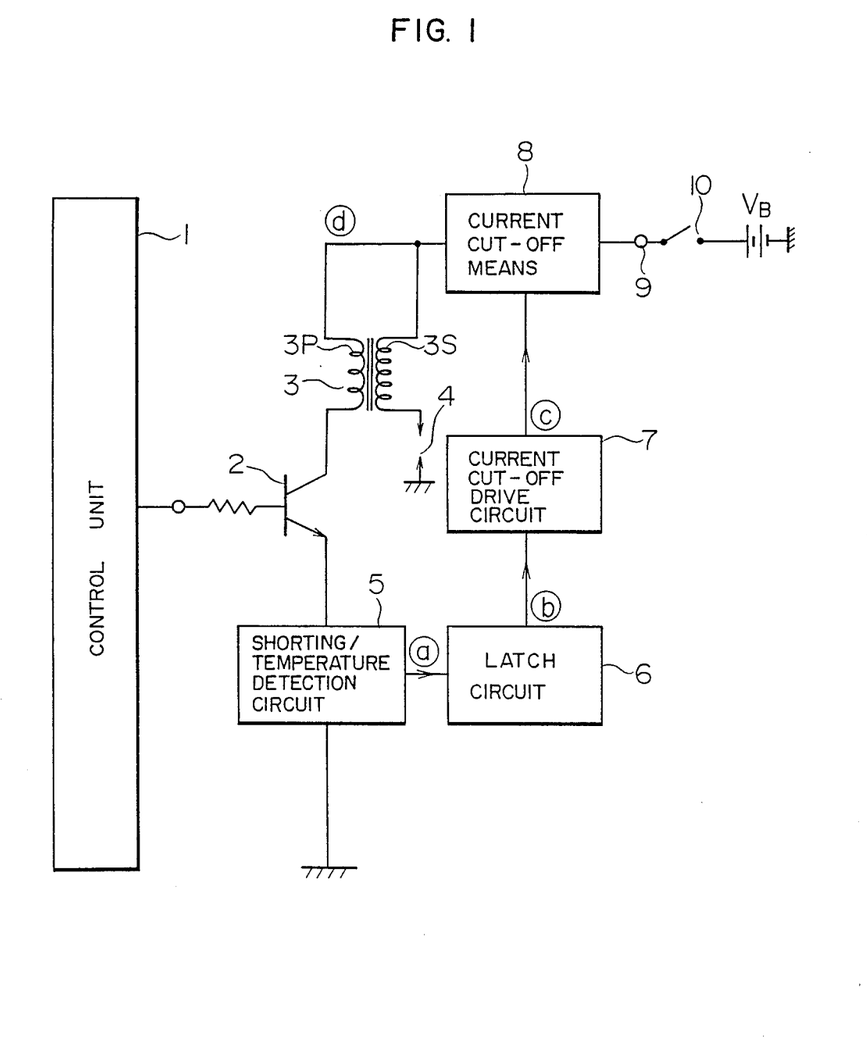
FIG. 1 is a circuit diagram showing a basic configuration of an ignition system for an internal combustion engine.

FIG. 1 is a circuit diagram showing a basic configuration of a ignition system according to a first embodiment of the present invention.

In FIG. 1, reference numeral 1 designates a control unit including a microcomputer or the like, numeral 2 a power switching device such as a power transistor or a power FET, numeral 3 an ignition coil including a primary winding 3P connected in series to the power switching device 2 for generating a high ignition voltage in the secondary winding 3S thereof, numeral 4 an ignition plug, and numeral 9 a voltage application terminal for connection to a battery voltage $V_B$ through a key switch 10.

In this basic configuration, an ignition system according to the present invention is further provided with a shorting/temperature detection circuit (a shorting detection circuit or a temperature detecting circuit) 5 for detecting a shorting breakdown and heat generation of the power switching device 2, a latch circuit 6, a current cut-off drive circuit 7 and a current cut-off means 8 making up separation means.

Now, the operation of this ignition system will be explained. The control unit 1, which is well known, is supplied with and processes various parameters (such as engine speed, water temperature and engine loads including throttle opening degree) representing the running conditions of the engine and applies a control signal to the base of a power transistor (or the gate terminal of a power FET) in series with the primary winding 3P of the ignition coil 3 in order to perform ignition at optimum ignition timing. Specifically, the power transistor 2 begins to conduct with a change of a control signal to an on-state and the primary current thus flows in the primary winding 3P of the ignition coil. Subsequently, with the arrival of an ignition timing, the control signal turns to an off state, so that the power transistor 2 suddenly switches to a non-conduction state. A high voltage signal is produced across the secondary winding 3S of the ignition coil 3, and a spark is generated in the ignition plug 4 to accomplish an ignition.

In this operation of an ignition system, assume that the power transistor 2 breaks down by shorting due to some causes including a manufacturing fault of the transistor or an over surge caused by a faulty contact. In spite of the on-off operation of the control unit 1, a current would continue to flow in the primary winding 3P of the ignition coil 3, and heat generated in the ignition coil 3 would produce smoke and burn the ignition coil in the worst case.

According to the present invention, the shorting-/temperature detection circuit 5 detects a shorting breakdown or a heat generation of the power transistor 2.

FIGS. 2(a) to (d) show waveforms produced at points (a) to (d) respectively in the circuit diagram of FIG. 1.

Figure 2:
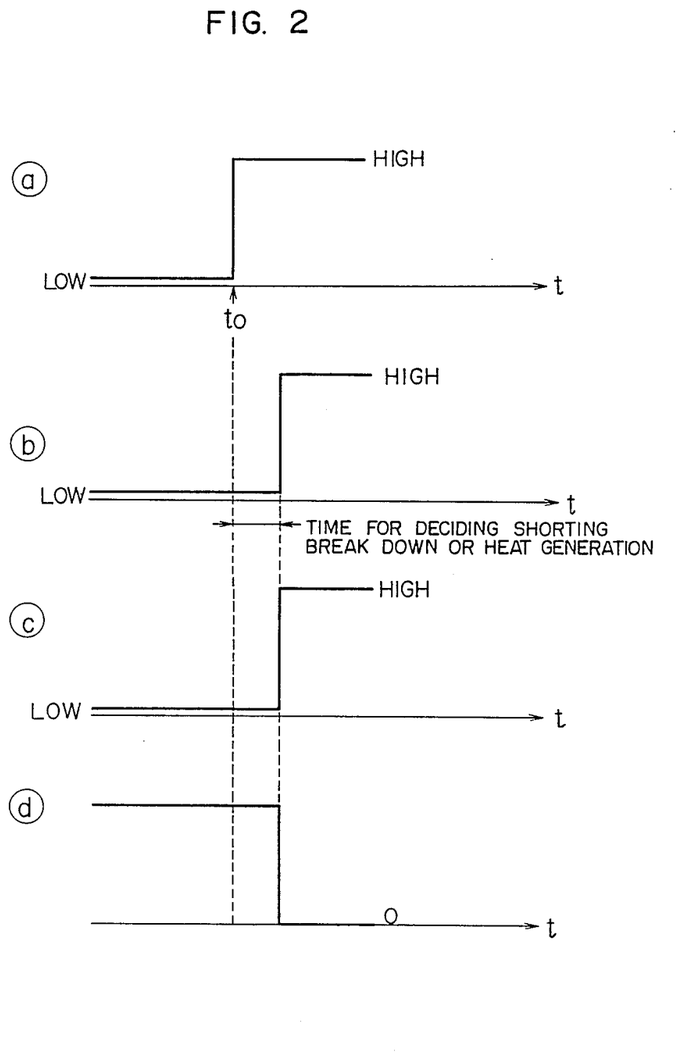
FIGS. 2 ⓐ to ⓓ are diagrams showing waveforms produced at various points in the circuit shown in FIG. 1.

FIG. 2(a) shows an output waveform produced upon detection of a shorting breakdown at a time point t₀ by the shorting/temperature detection circuit 5. Specifically, the output changes from a low level to high level after a shorting breakdown. In response to the output of the shorting/temperature detection circuit 5, the latch circuit 6 holds prevailing condition temporarily as shown in FIG. 2(b), so that the output thereof changed from low to high level. In this way, the latch circuit 6 is used for protecting a short signal.

As shown in FIG. 2(c), the latching operation of the latch circuit 6 turns the output of the current cut-off drive circuit 7 from a low to high level thereby to open the current cut-off means 8. As a result, as shown in FIG. 2(d), the primary current flowing through the power transistor 2 that has broken down by shorting and the primary winding of the ignition coil is reduced from a satuated level to zero, that is, cut off.

Figure 3:
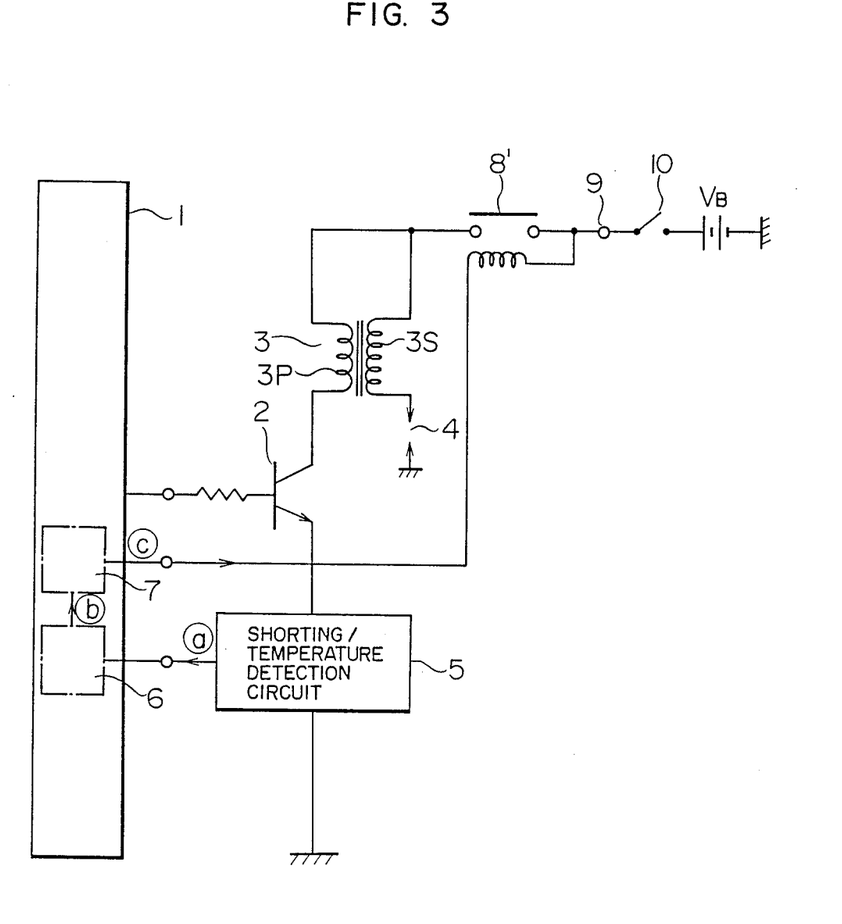
FIGS. 3 and 4 show modifications of the basic configuration of FIG. 1.
Figure 4:
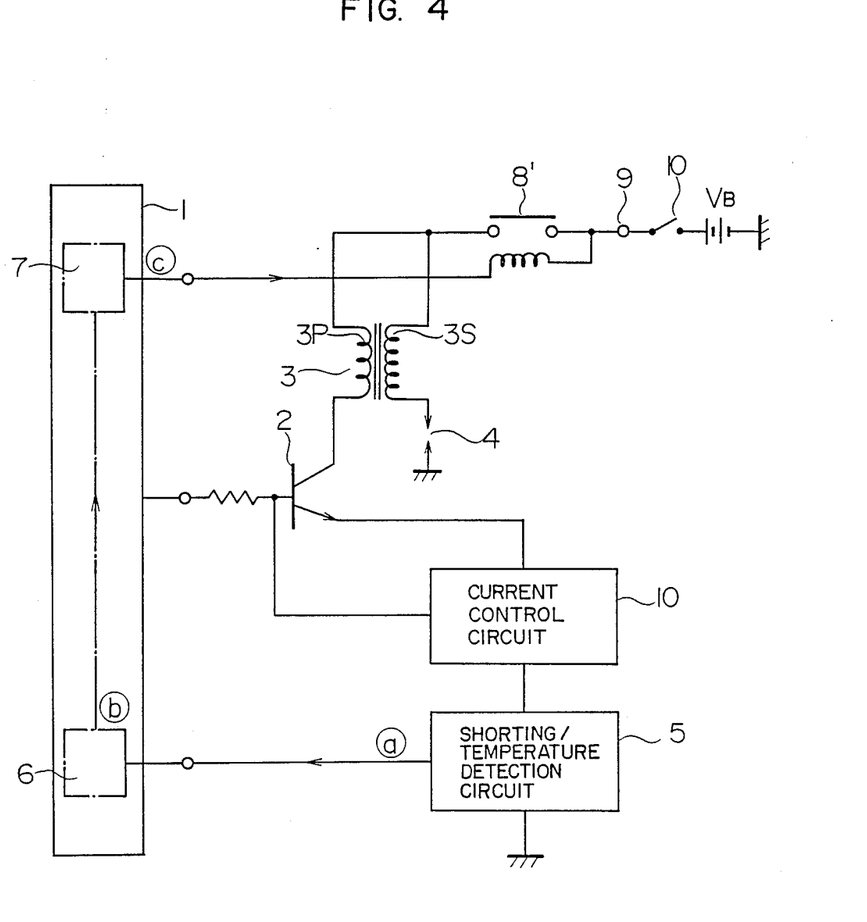

Basic configurations of the present invention according to other embodiments are shown in FIGS. 3 and 4 respectively. An ignition system according to a second embodiment shown in FIG. 3 uses a relay 8' as current cut-off means with the operation of a latch circuit 6 and a current cut-off drive circuit 7 in FIG. 1 built in the control unit 1. Specifically, an output from the shorting-/temperature detection circuit 5 is applied to the control unit 1, which decides whether the output of the shorting/temperature detection circuit 5 is at low or high level and energizes the coil of the relay 8' thereby to open the movable contact thereof, cutting off the primary current of the coil, as soon as the output of the shorting/temperature detection circuit 5 rises to the high level as shown in FIG. 2(a).

According to this configuration, the use of the mechanical relay 8' as current cut-off means realizes a comparatively inexpensive system. Further, since the functions of the latch circuit 6 and the current cut-off circuit 7 shown in FIG. 1 are built in the control unit 1, the construction of the whole ignition system is simplified and the reliability thereof improved, effectively contributing to a lower system cost.

FIG. 4 shows a third embodiment which additionally comprises a current control circuit 10 for controlling the value of the primary current. The current control circuit 10, which is inserted between the emitter of the power transistor 2 and the shorting/temperature detection circuit 5, has an output thereof fed back of the base of the power transistor 2. The addition of the current control circuit 10 permits the primary current of the ignition coil 3 to be limited to a predetermined value during normal operation of the power switching device 2, whereby the capacity of the power switching device 2 is comparatively saved, while at the same time making it possible to reduce the chip size thereof.

An ignition system for controlling the ignition of a single-cylinder engine was described above. An embodiment of a similar basic configuration applied to a multi-cylinder engine will be explained with reference to FIGS. 5 to 7.

Figure 5:
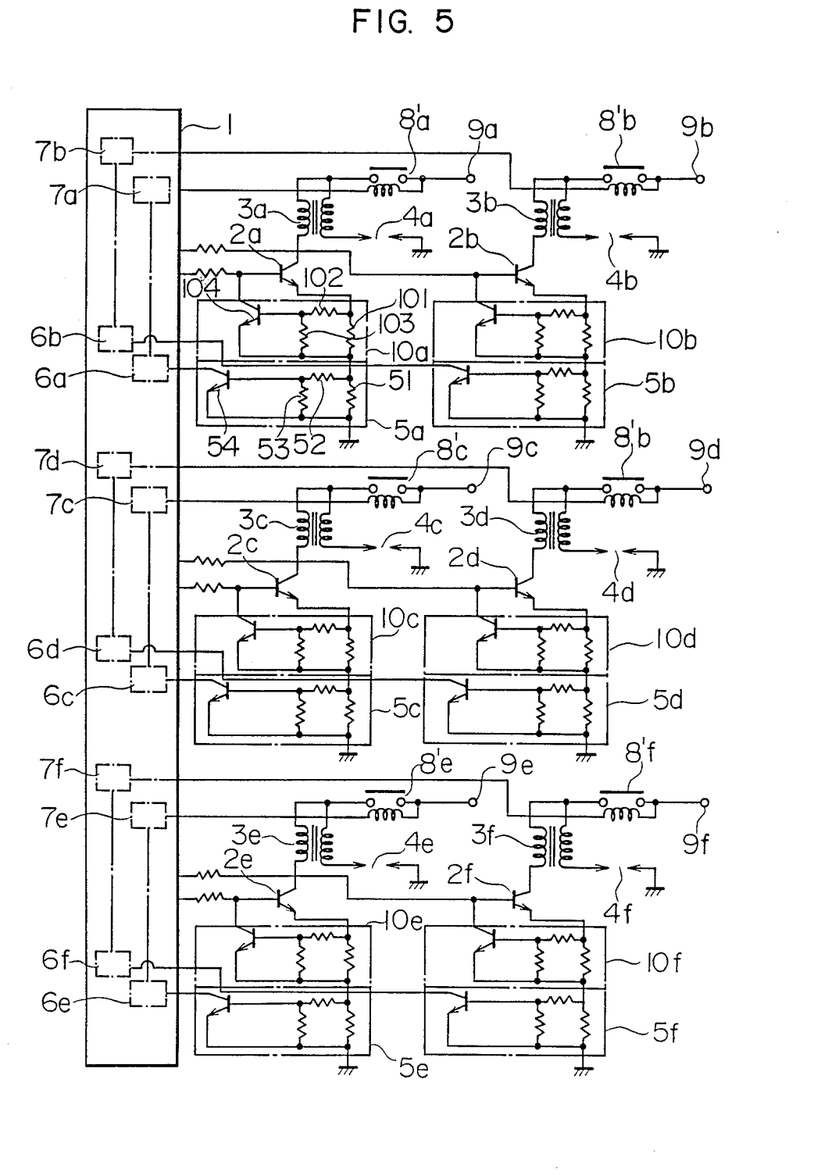
FIGS. 5 to 7 are diagrams of modifications showing applications of the ignition system for an internal combustion engine shown in FIG. 1 to a multicylinder ignition system.

FIG. 5 shows an ignition system for a 6-cylinder engine. Each cylinder has the basic configuration of an ignition system shown in FIG. 4, the component parts of which are distinguished by suffixes a to f attached to reference numerals for respective cylinders. As seen from FIG. 5, in this fourth embodiment each of the current control circuits 10a to 10f of the respective cylinders includes a detection resistor 101 connected in series to the emitter of a power transistor 2a making up a power switching device, voltage dividing resistors 102, 103 connected in parallel to the detection resistor 101, and a transistor 104 with the base thereof connected to the junction point of the voltage-dividing resistors 102 and 103, for example, in the case of the circuit 10a. The collector of the transistor 104 is connected to the base of the power transistor 2a. The control current to the base of the power transistor 2a is controlled by the conduction state of the transistor 104 thereby to control the primary current of the ignition coil 3a. The shorting/temperature detection circuit 5a, on the other hand, similarly includes a detection resistor 51 connected in series to the emitter of the power transistor 2a (that is, in series to the detection resistor 101 of the current circuit), voltage-dividing resistors 52, 53 connected in parallel to the detection resistor 51, and a transistor 54 with the base thereof connected to a junction point of the voltage-dividing resistors 52 and 53. The collector of the transistor 54 is connected to the controller 1, whereby upon detection of a shorting breakdown of the power transistor 2a, the transistor 54 begins to conduct thereby to input a shorting breakdown signal to the controller 1.

In this embodiment with the shorting/temperature detection circuits 5a to 5f and relays 8'a to 8'f provided for ignition circuits of respective cylinders, a shorting breakdown, if any, of some of the power transistors 2a to 2f separate only the ignition circuits including the power transistors broken by shorting by the function of the corresponding relays 8'a to 8'f from a power supply (not shown), while the remaining ignition circuits are kept operative. In other words, the engine is effectively partly kept in operation though not with full output capacity thereof.

Figure 6:
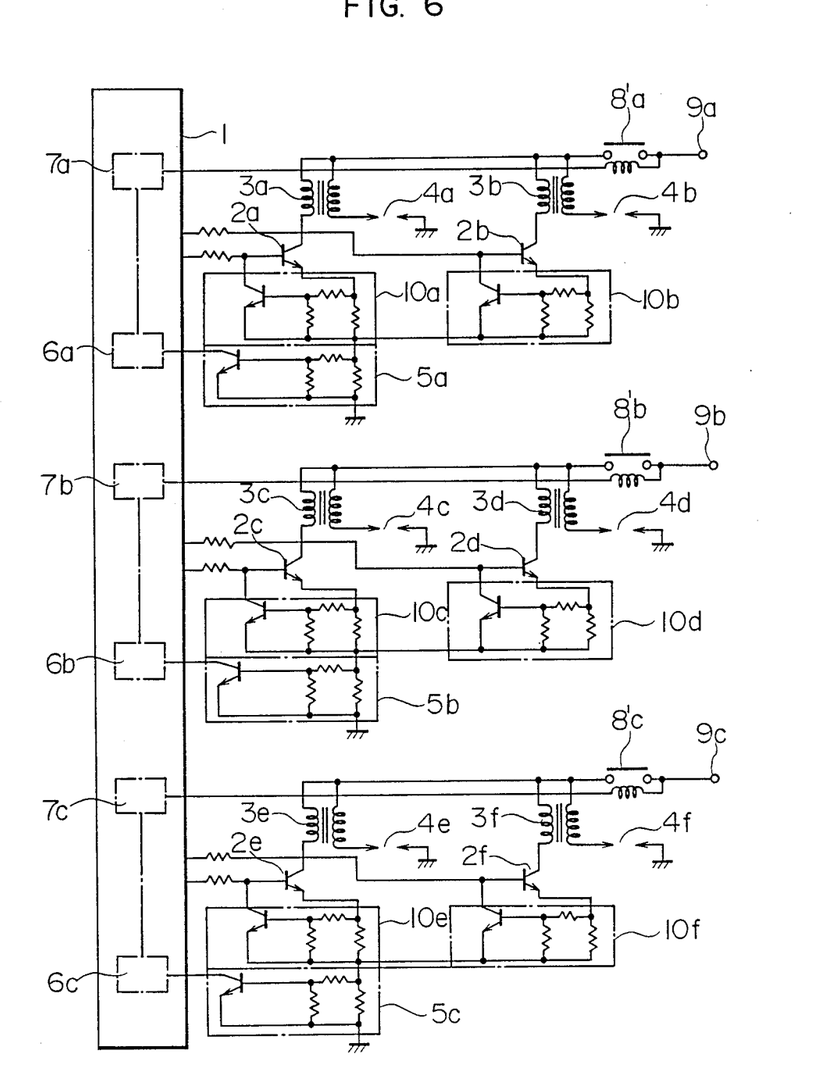

FIG. 6 shows a fifth embodiment making up another modification. In this system, the cylinders in FIG. 5 are combined into three pairs to share each of shorting-/temperature detection circuits 5a to 5c and relays 8'a to 8'c. If one of the power transistors 2a to 2b is broken by shorting in this fifth embodiment, ignition circuits including these two power transistors would be separated from a power supply (not shown). Nevertheless, the number of the relays and shorting detection circuits is reduced by one half, and thus provide a practical circuit low in cost.

Figure 7:
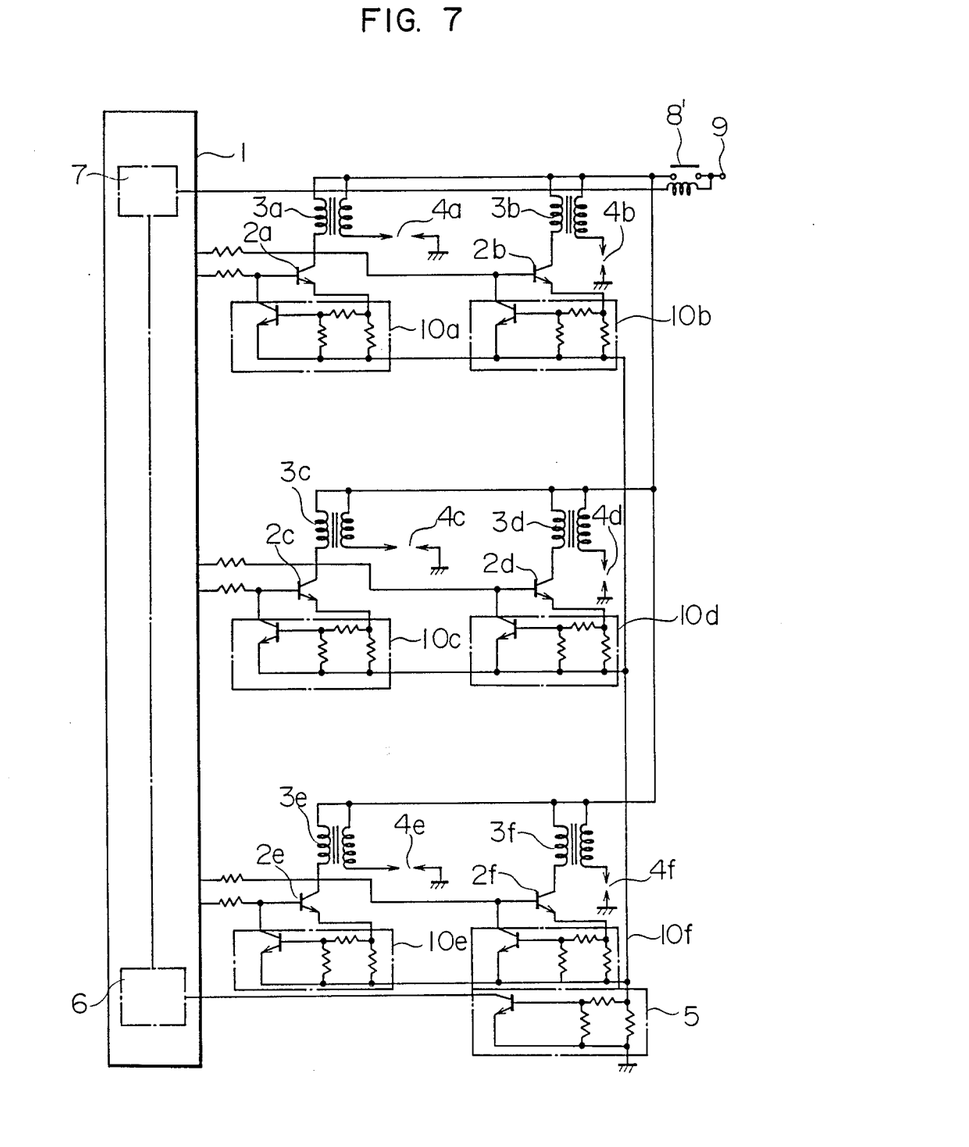

FIG. 7 shows a sixth embodiment with a relay 8' and a shorting/temperature detection circuit 5 shared by all the cylinders. Specifically, a single shorting/temperature detection circuit 5 detects a shorting breakdown or heat generation of any of the six power transistors 2a to 2f, and a single relay 8' is adapted to separate any of the circuits from a power supply. This system thus has an advantage that a single relay or shorting/temperature detection circuit serves the purpose for a lower cost.

As described above, an application of the fourth to sixth embodiments of the invention shown in FIGS. 5 to 7 respectively depends on the number of cylinders of the engine involved.

The current cut-off means 8 in FIG. 1 may be used with an alarm or a meter (not shown) energized to inform the driver of an engine fault in response to an output of the relay 8' in FIGS. 3 to 7.

It will thus be understood from the foregoing description that the present invention has the following great advantages:

1. When a power switching device such as a power transistor or a power FET is broken due to a shorting, an abnormal flow of the primary current in the primary winding of an ignition coil is detected by shorting breakdown detection means, and the ignition coil is separated from a power supply by current cut-off means, thus positively preventing the ignition coil from being abnormally heated. A dangerous accident of a fire or the like is prevented with a safe ignition system.

2. The number of shorting detection means or power separation means is reduced as required as compared with the number of power switching devices or ignition coils for a lower cost.

3. The operator is informed immediately of a fault of an ignition system by an alarm or a meter in the case of a shorting breakdown or a heat generation of a power switching device.

We claim:

1. An ignition system for an internal combustion engine, comprising:
    a plurality of power switching devices
    a control unit connected to said power switching devices for controlling the on/off operation of said power switching devices;
    a plurality of ignition coils, each connected to a respective one of said power switching devices and including a primary winding with the primary current flowing therein controlled by an interruption signal from the power switching device and a secondary winding across which a high voltage is generated by controlling the primary current flowing in the primary winding;
    shorting detection means for detecting a shorting breakdown of a power switching device; and
    power supply separation means responsive to said shorting detection means for separating an ignition coil from a power supply upon detection of a shorting breakdown of the power switching device connected to said ignition coil.

2. An ignition system for an internal combustion engine according to claim 1, wherein a plurality of shorting detection means and power supply separation means are provided in the same number as the number of power switching devices.

3. An ignition system for an internal combustion engine according to claim 1, wherein a plurality of shorting detection means and power supply separation means are provided in a number smaller than the number of power switching devices.

4. An ignition system for an internal combustion engine according to claim 1, wherein the shorting detection means and power supply separation means comprise a single shorting detector and a single power supply separation circuit for all of said ignition coils.

5. An ignition system for an internal combustion engine according to claim 1, further comprising a current control circuit interposed between the shorting detection means and the power switching devices.

6. An ignition system for an internal combustion engine according to claim 1, wherein selected one of an alarm and a meter is energized by an output of the power supply separation means.

* * * * *